United States Patent
Taguchi et al.

(10) Patent No.: US 9,068,267 B2
(45) Date of Patent: Jun. 30, 2015

(54) ETCHING LIQUID COMPOSITION AND ETCHING METHOD

(71) Applicant: ADEKA CORPORATION, Tokyo (JP)

(72) Inventors: Yuta Taguchi, Tokyo (JP); Kouta Saitoh, Tokyo (JP)

(73) Assignee: Adeka Corporation, Tokyo (JP)

( * ) Notice: Subject to any disclaimer, the term of this patent is extended or adjusted under 35 U.S.C. 154(b) by 0 days.

(21) Appl. No.: 14/371,572

(22) PCT Filed: Dec. 25, 2012

(86) PCT No.: PCT/JP2012/083435
§ 371 (c)(1),
(2) Date: Jul. 10, 2014

(87) PCT Pub. No.: WO2013/136624
PCT Pub. Date: Sep. 19, 2013

(65) Prior Publication Data
US 2015/0053888 A1    Feb. 26, 2015

(30) Foreign Application Priority Data

Mar. 13, 2012  (JP) .................................. 2012-055520

(51) Int. Cl.
| | | |
|---|---|---|
| C09K 13/00 | (2006.01) | |
| C23F 1/18 | (2006.01) | |
| C23F 1/16 | (2006.01) | |
| H01L 31/0224 | (2006.01) | |
| H01L 21/3213 | (2006.01) | |

(52) U.S. Cl.
CPC ... C23F 1/18 (2013.01); C23F 1/16 (2013.01); H01L 21/32134 (2013.01); H01L 31/022425 (2013.01); Y02E 10/50 (2013.01)

(58) Field of Classification Search
CPC ........ C23F 1/06; C23F 1/18; H01L 21/32134
USPC .................................................. 252/79.1–79.4
See application file for complete search history.

(56) References Cited

FOREIGN PATENT DOCUMENTS

| JP | 2006-111953 | 4/2006 |
|---|---|---|
| JP | 2008-547232 | 12/2008 |
| JP | 2009-167459 | 7/2009 |
| JP | 2009-206462 | 9/2009 |
| JP | 2009-231427 | 10/2009 |

OTHER PUBLICATIONS

International Search Report issued Mar. 26, 2013 in International (PCT) Application No. PCT/JP2012/083435.

*Primary Examiner* — Duy Deo
*Assistant Examiner* — Maki Angadi
(74) *Attorney, Agent, or Firm* — Wenderoth, Lind & Ponack, L.L.P.

(57) ABSTRACT

The etching liquid composition of the present invention contains a ferric ion component; a hydrogen chloride component; and a component that is at least one type of compound selected from the group consisting of a compound represented by general formula (1) below and a straight chain or branched chain alcohol having 1 to 4 carbon atoms:

[Chemical Formula 1]

$$R^1-O-(R^2-O)_n-R^3 \quad (1)$$

wherein $R^1$ and $R^3$ are each independently a hydrogen atom or a straight chain or branched chain alkyl group having 1 to 4 carbon atoms, $R^2$ is a straight chain or branched chain alkylene group having 1 to 4 carbon atoms, and n is a number between 1 and 3.

16 Claims, 1 Drawing Sheet

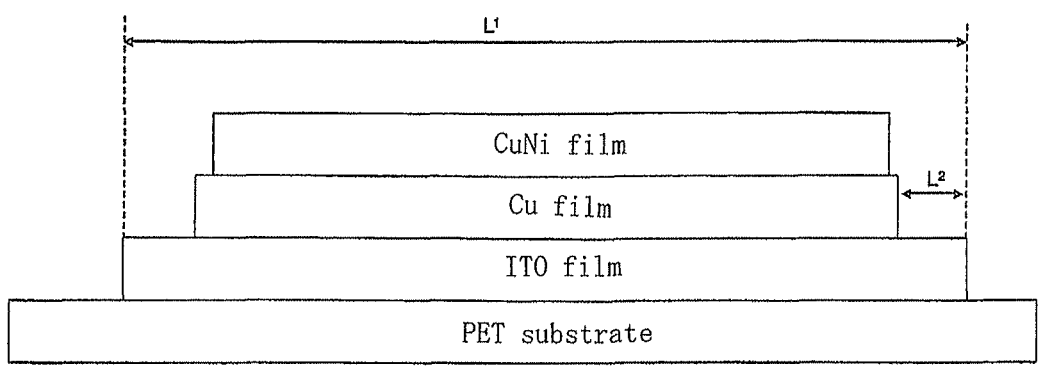

ETCHING LIQUID COMPOSITION AND ETCHING METHOD

TECHNICAL FIELD

The present invention relates to an etching liquid composition and an etching method that uses this etching liquid composition, more specifically to an etching liquid composition that is used to collectively etch a multilayer film formed of an indium oxide-based coating film and a metal-based coating film, and an etching method that uses the etching liquid composition.

BACKGROUND ART

A variety of techniques are known for wet etching indium oxide-based coating films used in transparent electrically conductive films and the like, but aqueous solutions containing hydrochloric acid are often used as etching liquid compositions due to them being inexpensive and exhibiting good etching speed.

For example, Patent Document 1 discloses an etching liquid composition for an indium-tin oxide (hereinafter abbreviated to ITO in some cases), which contains ferric chloride and hydrochloric acid.

In addition, as an example of etching liquid that does not use hydrochloric acid, Patent Document 2 discloses an aqueous solution that contains cupric ions, an organic acid, halogen ions, an azole compound and a poly(alkylene glycol) as an etching agent for copper and copper alloys. Here, the poly(alkylene glycol) is used to suppress dissolution of an electrolytic copper plating layer and to facilitate etching of an electroless copper plating layer that is an electrically conductive undercoat layer.

PRIOR ART DOCUMENTS

Patent Document

Patent Document 1: JP2009-231427 A
Patent Document 2: JP2006-111953 A

SUMMARY OF THE INVENTION

Problem to be Solved by the Invention

However, in cases where the above-mentioned etching liquids were used to form fine wiring having good linearity and formed of an ITO film and a copper film by collectively etching a multilayer film formed of the ITO film and the copper film, it was not possible to control the etching speed and obtain fine wiring having the desired width in some cases, and fine wiring meandered in some cases. In addition, a major source of problems, was that a difference in etching speeds between ITO film and copper film led to large differences between the width obtained by etching the ITO film in a direction parallel to the surface of the substrate and the width obtained by etching the copper film in the same direction, thereby causing the problem of large steps between the ITO film and the copper film on which the fine wiring was formed.

Accordingly, the present invention is aimed at solving the problems mentioned above and an object of the present invention to providing an etching liquid composition which, when collectively etching a multilayer film formed of an indium oxide-based coating film and a metal-based coating film, does not produce a large step between the indium oxide-based coating film and the metal-based coating film, causes little thinning of fine wires formed of the indium oxide-based coating film and the metal-based coating film, and can achieve etching with good linearity. The present invention is also aimed at providing an etching method that uses the etching liquid composition.

Means for Solving the Problem

As a result of diligent research into how to solve the problems mentioned above, the inventors of the present invention found that these problems could be solved by using an etching liquid composition that contains a ferric ion component; a hydrogen chloride component; and a component that is at least one type of compound selected from the group consisting of a compound represented by general formula (1) below and a straight chain or branched chain alcohol having 1 to 4 carbon atoms, and thereby completed the present invention.

[Chemical Formula 1]

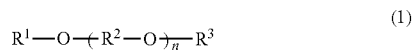
(1)

wherein $R^1$ and $R^3$ are each independently a hydrogen atom or a straight chain or branched chain alkyl group having 1 to 4 carbon atoms, $R^2$ is a straight chain or branched chain alkylene group having 1 to 4 carbon atoms, and n is a number between 1 and 3.

Accordingly, the present invention provides an etching liquid composition which is used to collectively etch a multilayer film formed of an indium oxide-based coating film and a metal-based coating film characterized in that the etching liquid composition is formed of an aqueous solution that contains:

(A) a ferric ion component (hereinafter referred to as component A in some cases);

(B) a hydrogen chloride component (hereinafter referred to as component B in some cases); and (C) a component that is at least one type of compound selected from the group consisting of a compound represented by general formula (1) above and a straight chain or branched chain alcohol having 1 to 4 carbon atoms (hereinafter referred to as component C in some cases).

In addition, the present invention provides an etching method for collectively etching a multilayer film formed of an indium oxide-based coating film and a metal-based coating film by using the above-mentioned etching liquid composition.

Effect of the Invention

By using the etching liquid composition of the present invention, it is possible to achieve the effects of not producing large steps between an indium oxide-based coating film and a metal-based coating film, causing little thinning of fine wires formed of the indium oxide-based coating film and the metal-based coating film, and achieve etching with good linearity when collectively etching a multilayer film formed of an indium oxide-based coating film and a metal-based coating film.

Therefore, the etching liquid composition of the present invention can be advantageously used in an etching method used to form fine wiring by collectively etching an ITO coating film and a metal-based coating film in particular.

BRIEF DESCRIPTION OF DRAWINGS

FIG. 1 is a schematic drawing showing the relationship between $L^1$ and $L^2$ in an evaluation test.

BEST MODE FOR CARRYING OUT THE INVENTION

Modes for carrying out the invention will now be explained in detail.

First, although the term "indium oxide-based coating film" described in the present Description is not particularly limited as long as this is a film that contains indium oxide, this is a general term for a coating film formed of at least one type selected from for example, indium oxide, indium-tin oxide and indium-zinc oxide.

In addition, although the term "metal-based coating film" described in the present Description is not particularly limited as long as this is a coating film formed of a metal, this is a general term for a coating film of a metal selected from the group consisting of for example, copper, nickel, titanium, chromium, silver, molybdenum, aluminum, platinum and palladium, or the like or an alloy coating film containing two or more metals selected from the group consisting of copper, nickel, titanium, chromium, silver, molybdenum, aluminum, platinum and palladium, for example an alloy coating film such as CuNi, CuNiTi, NiCr or Ag—Pd—Cu.

The ferric ion component (A) used in the etching liquid composition of the present invention is a component that constitutes the main agent of the etching liquid composition of the present invention. The compound used as the ferric ion component is not particularly limited, and should be a compound able to supply ferric ions, examples of which include iron (III) chloride, iron (III) bromide, iron (III) iodide, iron (III) sulfate, iron (III) nitrate and iron (III) acetate, and these compounds may be either anhydrous or hydrated. It is possible to use a combination of two or more of the aforementioned compounds able to supply ferric ions.

Although the preferred concentration of ferric ions (A) in the etching liquid composition of the present invention can be adjusted as appropriate according to the desired thickness or width of the multilayer film formed of an indium oxide-based coating film and a metal-based coating film that is the material to be etched, it is 0.1 to 15 mass %, and preferably 1 to 10 mass %. If the concentration of ferric ions (A) is lower than 0.1 mass %, it may not be possible to achieve a satisfactory etching speed, which is not desirable. Meanwhile, if the concentration of ferric ions (A) exceeds 15 mass %, this compound may become insoluble in cases where a compound represented by general formula (1) above is used as component (C), which is not desirable.

The hydrogen chloride component (B) used in the etching liquid composition of the present invention is a component that constitutes the main agent of the etching liquid composition of the present invention.

Although the preferred concentration of the hydrogen chloride component (B) in the etching liquid composition of the present invention can be adjusted as appropriate according to the desired thickness or width of the multilayer film formed of an indium oxide-based coating film and a metal-based coating film that is the material to be etched, it is 0.1 to 25 mass %, and preferably 1 to 20 mass %. If the concentration of the hydrogen chloride component (B) is lower than 0.1 mass %, it may not be possible to achieve a satisfactory etching speed, which is not desirable. Meanwhile, even if the concentration of the hydrogen chloride component (B) exceeds 25 mass %, no improvement in etching speed is observed and defects such as corrosion of components in the apparatus may occur, which is not desirable.

When used in combination with the ferric ion component (A) and the hydrogen chloride component (B), component (C) used in the etching liquid composition of the present invention, which is at least one type of compound selected from the group consisting of a compound represented by general formula (1) above and a straight chain or branched chain alcohol having 1 to 4 carbon atoms, it is possible for the etching liquid composition of the present invention to achieve the effect of reducing the degree of thinning of fine wires, the effect of improving linearity and the effect of suppressing large steps when collectively etching a multilayer film formed of an indium oxide-based coating film and a metal-based coating film.

When used in the etching liquid composition of the present invention, examples of the straight chain or branched chain alkyl group having 1 to 4 carbon atoms represented by $R^1$ and $R^3$ in general formula (1) above include hydrogen atoms, a methyl group, ethyl group, propyl group, isopropyl group, butyl group, secondary butyl group, tertiary butyl group and isobutyl group, and examples of the straight chain or branched chain alkylene group having 1 to 4 carbon atoms represented by $R^2$ include a methylene group, an ethylene group, a propylene group, an isopropylene group, a butylene group, a secondary butylene group, a tertiary butylene group and an isobutylene group. Of these, it is preferable for $R^1$ and $R^3$ to be hydrogen atoms, a methyl group, ethyl group, propyl group, butyl group, and the like, and for $R^2$ to be an ethylene group, a propylene group, and the like.

Specific examples of compounds represented by general formula (1) above include glycol ethers such as ethylene glycol monomethyl ether, diethylene glycol monomethyl ether, triethylene glycol monomethyl ether, ethylene glycol monoisopropyl ether, diethylene glycol monoisopropyl ether, ethylene glycol monobutyl ether, diethylene glycol monobutyl ether, triethylene glycol monobutyl ether, ethylene glycol monoisobutyl ether, diethylene glycol monoisobutyl ether, propylene glycol monomethyl ether, dipropylene glycol monomethyl ether, tripropylene glycol monomethyl ether, propylene glycol monopropyl ether, dipropylene glycol monopropyl ether, propylene glycol monobutyl ether, dipropylene glycol monobutyl ether, tripropylene glycol monobutyl ether, ethylene glycol dimethyl ether, diethylene glycol dimethyl ether, triethylene glycol dimethyl ether, diethylene glycol methyl ethyl ether, diethylene glycol diethyl ether, diethylene glycol dibutyl ether and dipropylene glycol dimethyl ether, and specific examples of straight chain or branched chain alcohols having 1 to 4 carbon atoms include alcohols such as methanol, ethanol, propanol, isopropanol, butanol, 2-butanol, isobutanol and t-butanol.

Furthermore, by using a compound represented by general formula (2) below or a branched-chain alcohol having 3 to 4 carbon atoms as the above-mentioned compound represented by general formula (1), the step between the indium oxide-based coating film and the metal-based coating film is small, the degree of thinning of fine wires is small, and it is possible to obtain wires having good linearity. In addition, the use of dipropylene glycol monomethyl ether or isopropanol is particularly preferred due to effects such as those mentioned above being particularly high. In addition, in cases where the etching liquid composition of the present invention is used in an etching process in which a resin resist is used, the use of isopropanol is particularly preferred due to isopropanol having no effect on the resin resist.

Moreover, it is possible to use a combination of two or more types of the aforementioned compound represented by general formula (1) and straight chain or branched chain alcohols having 1 to 4 carbon atoms.

[Chemical Formula 2] (2)

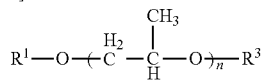

[wherein $R^1$, $R^3$ and n have the same meanings as $R^1$, $R^3$ and n in general formula (1) above.]

Although the preferred concentration of component (C) in the etching liquid composition of the present invention can be adjusted as appropriate according to the desired thickness or width of the multilayer film formed of an indium oxide-based coating film and a metal-based coating film that is the material to be etched, it is 0.01 to 10 mass %, and preferably 0.1 to 5 mass %. The effect of blending component (C) is not realized if the concentration thereof is lower than 0.01 mass %, and a further improvement in the effect of blending component (C) is not observed even if the concentration thereof exceeds 10 mass %.

In addition to component (A), component (B) and component (C) described above, it is possible to blend other well-known additives in the etching liquid composition of the present invention at levels that do not impair the effect of the present invention. Examples of such additives include stabilizers for the etching liquid composition, solubilizing agents for the components in the composition, anti-foaming agents, pH adjusting agents, specific gravity adjusting agents, viscosity modifiers, wettability improving agents, chelating agents, oxidizing agents, reducing agents and surfactants, and in cases where these additives are used, the concentration thereof is generally 0.001 mass % to 10 mass % per additive.

Moreover, in cases where the etching speed of the etching liquid composition of the present invention is too high, it is preferable to use a reducing agent as an additive, and examples thereof include copper chloride, ferrous chloride, copper powder and silver powder. Moreover, in cases where a reducing agent is added, the concentration thereof is preferably 0.01 to 10 mass %.

The etching liquid composition of the present invention is used when collectively etching a multilayer film formed of an indium oxide-based coating film and a metal-based coating film. The indium oxide-based coating film may be a single layer or a multilayer film formed of two or more layers. In addition, the metal-based coating film may be a single layer or a multilayer film formed of two or more layers. In the multilayer film formed of an indium oxide-based coating film and a metal-based coating film, a metal-based coating film may be formed above, below, or above and below an indium oxide-based coating film. In addition, in the multilayer film formed of an indium oxide-based coating film and a metal-based coating film, indium oxide-based coating films and metal-based coating films may be alternately laminated.

Examples of devices having a multilayer film formed of an indium oxide-based coating film and a metal-based coating film such as that described above include liquid crystal displays, plasma displays, touch panels, organic EL devices, solar cells and lighting equipment, and it is possible to use the etching liquid composition of the present invention when processing electrodes or wiring in these devices.

The etching method for collectively etching a multilayer film formed of an indium oxide-based coating film and a metal-based coating film by using the etching liquid composition of the present invention is not particularly limited, and should be an ordinary well-known etching method. Examples thereof include dip type, spray type and spin type etching methods. Of these, in cases where a PET substrate having CuNi/Cu/ITO layers formed thereupon is etched by using a dip type etching method, the substrate is dipped in the etching liquid composition of the present invention, immersed under suitable etching conditions and then withdrawn from the etching liquid composition, thereby collectively etching the CuNi/Cu/ITO layers on the PET substrate.

The etching conditions are not particularly limited, and can be set arbitrarily according to the form and thickness of the object being etched. For example, the etching temperature is preferably 10° C. to 60° C., and more preferably 30° C. to 50° C. Because the temperature of the etching liquid composition can, in some cases, increase due to the heat of reaction, the temperature may, if necessary, be controlled by publicly known means in order to maintain the temperature range mentioned above. In addition, the etching time is not particularly limited as long as this time is sufficient for the object being etched to be completely etched. For example, for an etching target having a thickness of approximately 500 to 2000 Å, such as one used when producing wiring on an electronic circuit board, etching should be carried out for approximately 0.2 to 5 minutes within the above-mentioned temperature range.

EXAMPLES

The present invention will now be explained in greater detail through the use of working examples and comparative examples, but it should be understood that the present invention is not limited to these examples.

Example 1

Present Invention Products 1 to 19 were obtained by blending etching liquid compositions according to the formulations shown in Table 2, using the compounds shown in Table 1 as component (C). Moreover, the balance of each formulation is water.

TABLE 1

| Compound A | Dipropylene glycol monomethyl ether |
| Compound B | Propylene glycol monomethyl ether |
| Compound C | Diethylene glycol monomethyl ether |
| Compound D | Butylpropylene diglycol |
| Compound E | Dipropylene glycol monobutyl ether |
| Compound F | Ethylene glycol |
| Compound G | Dipropylene glycol dimethyl ether |
| Compound H | Ethanol |
| Compound I | 2-propanol |

TABLE 2

| Inventive Product | Component (A) (Concentration*[1]) | Component (B) (Concentration) | Component (C)-1 (Concentration) | Component (C)-2 (Concentration) | Added Component (Concentration) |
|---|---|---|---|---|---|
| 1 | Ferric chloride (8 mass %) | Hydrogen chloride (12 mass %) | Compound A (1 mass %) | None | Copper powder (1 mass %) |
| 2 | Ferric chloride (8 mass %) | Hydrogen chloride (12 mass %) | Compound B (1 mass %) | None | Copper powder (1 mass %) |
| 3 | Ferric chloride (8 mass %) | Hydrogen chloride (12 mass %) | Compound C (1 mass %) | None | Copper powder (1 mass %) |

TABLE 2-continued

| Inventive Product | Component (A) (Concentration*[1]) | Component (B) (Concentration) | Component (C)-1 (Concentration) | Component (C)-2 (Concentration) | Added Component (Concentration) |
|---|---|---|---|---|---|
| 4 | Ferric chloride (8 mass %) | Hydrogen chloride (12 mass %) | Compound D (1 mass %) | None | Copper powder (1 mass %) |
| 5 | Ferric chloride (8 mass %) | Hydrogen chloride (12 mass %) | Compound E (1 mass %) | None | Copper powder (1 mass %) |
| 6 | Ferric chloride (8 mass %) | Hydrogen chloride (12 mass %) | Compound F (1 mass %) | None | Copper powder (1 mass %) |
| 7 | Ferric chloride (8 mass %) | Hydrogen chloride (12 mass %) | Compound G (1 mass %) | None | Copper powder (1 mass %) |
| 8 | Ferric chloride (8 mass %) | Hydrogen chloride (12 mass %) | Compound H (1 mass %) | None | Copper powder (1 mass %) |
| 9 | Ferric chloride (8 mass %) | Hydrogen chloride (12 mass %) | Compound I (1 mass %) | None | Copper powder (1 mass %) |
| 10 | Ferric chloride (8 mass %) | Hydrogen chloride (12 mass %) | Compound A (1 mass %) | Compound F (1 mass %) | Copper powder (1 mass %) |
| 11 | Ferric chloride (8 mass %) | Hydrogen chloride (12 mass %) | Compound A (1 mass %) | Compound H (1 mass %) | Copper powder (1 mass %) |
| 12 | Ferric chloride (8 mass %) | Hydrogen chloride (12 mass %) | Compound A (1 mass %) | None | None |
| 13 | Ferric chloride (5 mass %) | Hydrogen chloride (12 mass %) | Compound A (1 mass %) | None | Copper powder (1 mass %) |
| 14 | Ferric chloride (8 mass %) | Hydrogen chloride (5 mass %) | Compound A (1 mass %) | None | Copper powder (1 mass %) |
| 15 | Ferric chloride (8 mass %) | Hydrogen chloride (12 mass %) | Compound A (3 mass %) | None | Copper powder (1 mass %) |
| 16 | Ferric chloride (8 mass %) | Hydrogen chloride (12 mass %) | Compound A (1 mass %) | None | Copper powder (8 mass %) |
| 17 | Ferric chloride (8 mass %) | Hydrogen chloride (12 mass %) | Compound A (1 mass %) | None | Copper chloride (1 mass %) |
| 18 | Ferric chloride (8 mass %) | Hydrogen chloride (12 mass %) | Compound A (1 mass %) | None | Ferrous chloride (1 mass %*[2]) |
| 19 | Ferric chloride (8 mass %) | Hydrogen chloride (12 mass %) | Compound A (1 mass %) | None | Silver powder (1 mass %) |

*[1]Indicates concentration of ferric ions
*[2]Indicates concentration of ferrous ions Comparative Example 1

Comparative Products 1 to 5 were obtained by blending etching liquid compositions according to the formulations shown in Table 3. Moreover, the balance of each formulation is water.

TABLE 3

| Comparative Product | Component (A) (Concentration*[3]) | Component (B) (Concentration) | Component (C) (Concentration) | Added Component (Concentration) |
|---|---|---|---|---|
| 1 | Ferric chloride (8 mass %) | Hydrogen chloride (12 mass %) | None | None |
| 2 | Ferric chloride (8 mass %) | Hydrogen chloride (12 mass %) | None | Copper powder (1 mass %) |
| 3 | Ferric sulfate (8 mass %) | Hydrogen chloride (12 mass %) | None | Copper powder (1 mass %) |
| 4 | Ferric chloride (5 mass %) | Hydrogen chloride (12 mass %) | None | Copper powder (1 mass %) |
| 5 | Ferric chloride (8 mass %) | Hydrogen chloride (5 mass %) | None | Copper powder (1 mass %) |

*[3]Indicates concentration of ferric ions

Example 2

Test pieces were obtained by cutting substrates, which were obtained by forming a resist pattern having a width of 75 μm and an opening of 25 μm on CuNi/Cu/ITO/PET substrates using a positive liquid resist, to a length of 20 mm and a width of 20 mm. The test pieces were subjected to dip type etching for 1 minute at 40° C. under stirring using the etching liquid compositions of Present Invention Products 1 to 19 prepared in Working Example 1.

Comparative Example 2

Test pieces were obtained by cutting substrates, which were obtained by forming a resist pattern having a width of 75 μm and an opening of 25 μm on CuNi/Cu/ITO/PET substrates using a positive liquid resist, to a length of 20 mm and a width of 20 mm. The test pieces were subjected to dip type etching for 1 minute at 40° C. under stirring using the etching liquid compositions of Comparative Products 1 to 5 prepared in Comparative Example 1.

Evaluation Tests

The fine wires obtained in Example 2 and Comparative Example 2 were evaluated in terms of the linearity of the fine wires, the width ($L^1$) of the fine wires and the size of the step ($L^2$) between the ITO and the Cu by means of a laser microscope. The linearity of the fine wires was evaluated by confirming whether or not meandering had occurred on the sides of the fine wires. Specifically, cases in which meandering was visible to the naked eye on the fine wires were evaluated as x, and cases in which such meandering was not visible were evaluated as ○. The size of the step ($L^2$) between the ITO and the Cu was calculated as the absolute value of the difference between the width of the wire of the ITO film and the width of the wire of the Cu film on one side of the obtained wiring. The results are shown in Table 4.

TABLE 4

| Composition | Linearity | $L^1/\mu m$ | $L^2/\mu m$ |
| --- | --- | --- | --- |
| Comparative Product 1 | X | 22.5 | 35.0 |
| Comparative Product 2 | X | 39.2 | 19.6 |
| Comparative Product 3 | X | 44.4 | 19.6 |
| Comparative Product 4 | ○ | 57.1 | 14.6 |
| Comparative Product 5 | X | 36.3 | 24.6 |
| Inventive Product 1 | ○ | 65.8 | 4.4 |
| Inventive Product 2 | ○ | 56.4 | 9.6 |
| Inventive Product 3 | ○ | 56.4 | 11.5 |
| Inventive Product 4 | ○ | 55.0 | 11.0 |
| Inventive Product 5 | ○ | 50.0 | 9.4 |
| Inventive Product 6 | ○ | 49.8 | 10.6 |
| Inventive Product 7 | ○ | 62.9 | 5.6 |
| Inventive Product 8 | ○ | 62.7 | 7.3 |
| Inventive Product 9 | ○ | 65.0 | 5.2 |
| Inventive Product 10 | ○ | 65.8 | 4.2 |
| Inventive Product 11 | ○ | 66.2 | 4.6 |
| Inventive Product 12 | ○ | 63.6 | 5.6 |
| Inventive Product 13 | ○ | 66.5 | 4.6 |
| Inventive Product 14 | ○ | 62.9 | 10.6 |
| Inventive Product 15 | ○ | 64.7 | 4.5 |
| Inventive Product 16 | ○ | 65.6 | 4.4 |
| Inventive Product 17 | ○ | 64.5 | 5.6 |
| Inventive Product 18 | ○ | 64.2 | 5.0 |
| Inventive Product 19 | ○ | 64.5 | 5.0 |

It can be seen from the results in Table 4 that fine wires having poor linearity were obtained in Comparative Products 1, 2, 3 and 5, whereas fine wires having good linearity were obtained in all of Inventive Products 1 to 19. In addition, it is understood that in Inventive Products 1 to 19, thicker wires than those in Comparative Products 1 to 5 were obtained without large steps being produced.

From this, it is understood that the etching liquid composition of the present invention is an etching liquid composition which, when used to collectively etch an indium oxide-based coating film and a metal-based coating film, causes little thinning of fine wires, does not produce a large step between the indium oxide-based coating film and the metal-based coating film, and can produce fine wires having good linearity.

The invention claimed is:

1. An etching liquid composition which is used to collectively etch a multilayer film formed of an indium oxide-based coating film and a metal-based coating film characterized in that the etching liquid composition is formed of an aqueous solution that contains:
   (A) a ferric ion component;
   (B) a hydrogen chloride component; and
   (C) a component that is at least one type of compound selected from the group consisting of a compound represented by general formula (1) below and a straight chain or branched chain alcohol having 1 to 4 carbon atoms:

[Chemical Formula 1]

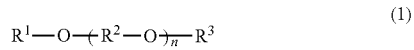

(1)

wherein $R^1$ and $R^3$ are each independently a hydrogen atom or a straight chain or branched chain alkyl group having 1 to 4 carbon atoms, $R^2$ is a straight chain or branched chain alkylene group having 1 to 4 carbon atoms, and n is a number between 1 and 3.

2. The etching liquid composition according to claim 1, wherein the compound represented by general formula (1) is a component that is at least one type of compound selected from the group consisting of a compound represented by general formula (2) below and a branched chain alcohol having 3 to 4 carbon atoms:

[Chemical Formula 2]

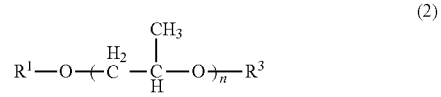

(2)

wherein $R^1$ and $R^3$ are each independently a hydrogen atom or a straight chain or branched chain alkyl group having 1 to 4 carbon atoms, and n is a number between 1 and 3.

3. The etching liquid composition according to claim 2, wherein the component (C) contains at least dipropylene glycol monomethyl ether or isopropanol.

4. The etching liquid composition according to claim 2, which further contains one or more types of additive selected from the group consisting of stabilizers, solubilizing agents for components (A), (B) or (C), anti-foaming agents, pH adjusting agents, specific gravity adjusting agents, viscosity modifiers, wettability improving agents, chelating agents, oxidizing agents, reducing agents and surfactants.

5. An etching method for collectively etching a multilayer film formed of an indium oxide-based coating film and a metal-based coating film, wherein the etching liquid composition described in claim 2 is used as an etching liquid composition.

6. The etching liquid composition according to claim 1, wherein the component (C) contains at least dipropylene glycol monomethyl ether or isopropanol.

7. The etching liquid composition according to claim 6, which further contains one or more types of additive selected from the group consisting of stabilizers, solubilizing agents for components (A), (B) or (C), anti-foaming agents, pH adjusting agents, specific gravity adjusting agents, viscosity modifiers, wettability improving agents, chelating agents, oxidizing agents, reducing agents and surfactants.

8. An etching method for collectively etching a multilayer film formed of an indium oxide-based coating film and a metal-based coating film, wherein the etching liquid composition described in claim 6 is used as an etching liquid composition.

9. The etching liquid composition according to claim 1, which further contains one or more types of additive selected from the group consisting of stabilizers, solubilizing agents for components (A), (B) or (C), anti-foaming agents, pH adjusting agents, specific gravity adjusting agents, viscosity modifiers, wettability improving agents, chelating agents, oxidizing agents, reducing agents and surfactants.

10. The etching liquid composition according to claim 9, wherein the additive is a reducing agent.

11. An etching method for collectively etching a multilayer film formed of an indium oxide-based coating film and a metal-based coating film, wherein the etching liquid composition described in claim 10 is used as an etching liquid composition.

12. An etching method for collectively etching a multilayer film formed of an indium oxide-based coating film and a metal-based coating film, wherein the etching liquid composition described in claim 9 is used as an etching liquid composition.

13. An etching method for collectively etching a multilayer film formed of an indium oxide-based coating film and a metal-based coating film, wherein the etching liquid composition described in claim 1 is used as an etching liquid composition.

14. The etching method according to claim 13, wherein the indium oxide-based coating film is a film having one or more layers selected from the group consisting of an indium oxide coating film, an indium-tin oxide coating film and an indium-zinc oxide coating film.

15. The etching method according to claim 13, wherein the metal-based coating film is a film having one or more layers formed of a coating film of a metal selected from the group consisting of copper, nickel, titanium, chromium, silver, molybdenum, aluminum, platinum and palladium and/or an alloy coating film containing two or more metals selected from the group consisting of copper, nickel, titanium, chromium, silver, molybdenum, aluminum, platinum and palladium.

16. The etching method according to claim 14, wherein the metal-based coating film is a film having one or more layers formed of a coating film of a metal selected from the group consisting of copper, nickel, titanium, chromium, silver, molybdenum, aluminum, platinum and palladium and/or an alloy coating film containing two or more metals selected from the group consisting of copper, nickel, titanium, chromium, silver, molybdenum, aluminum, platinum and palladium.

\* \* \* \* \*